(12) United States Patent
Diaz (10) Patent No.: US 10,820,445 B2
(45) Date of Patent: Oct. 27, 2020

(54) COOLING SYSTEM FOR DOUBLE SIDED DISPLAY ASSEMBLY

(71) Applicant: Manufacturing Resources International, Inc., Alpharetta, GA (US)

(72) Inventor: Marcos Diaz, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 0 days.

(21) Appl. No.: 15/450,365

(22) Filed: Mar. 6, 2017

(65) Prior Publication Data

US 2017/0257978 A1  Sep. 7, 2017

Related U.S. Application Data

(60) Provisional application No. 62/303,806, filed on Mar. 4, 2016.

(51) Int. Cl.
*H05K 7/20* (2006.01)
*B60R 11/02* (2006.01)
*B60R 11/00* (2006.01)

(52) U.S. Cl.
CPC ...... *H05K 7/20145* (2013.01); *B60R 11/0229* (2013.01); *H05K 7/20154* (2013.01); *H05K 7/20972* (2013.01); *B60R 2011/004* (2013.01)

(58) Field of Classification Search
CPC ............ H05K 7/20145; H05K 7/20154; B60R 11/0229; B60R 2011/004
USPC ........................................................ 361/692
See application file for complete search history.

(56) References Cited

U.S. PATENT DOCUMENTS

| 4,093,355 A | 6/1978 | Kaplit et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |

(Continued)

FOREIGN PATENT DOCUMENTS

| AU | 2011248190 B2 | 5/2011 |
| CN | 2702363 Y | 5/2005 |

(Continued)

OTHER PUBLICATIONS

Itsenclosures, Product Catalog, 2009, 48 pages.

(Continued)

*Primary Examiner* — Anatoly Vortman
*Assistant Examiner* — Zhengfu J Feng
(74) *Attorney, Agent, or Firm* — Standley Law Group LLP; Jeffrey S. Standley; Adam J. Smith (57) ABSTRACT

A pair of electronic displays are placed back to back and are configured for mounting to a vehicle. A pair of thermal plates are located behind the electronic displays and a pair of transparent plates are located in front of the electronic displays. A closed loop of air travels vertically through the space between the electronic displays and transparent panels and through a closed loop plenum. An open loop of air travels horizontally through the space between thermal plates and the rear surface of the electronic displays.

6 Claims, 6 Drawing Sheets

(56) References Cited

U.S. PATENT DOCUMENTS

| | | | |
|---|---|---|---|
| 4,952,925 A | 8/1990 | Haastert | |
| 5,029,982 A | 7/1991 | Nash | |
| 5,088,806 A | 2/1992 | McCartney et al. | |
| 5,132,666 A * | 7/1992 | Fahs | B60Q 1/503 224/329 |
| 5,247,374 A | 9/1993 | Terada | |
| 5,282,114 A | 1/1994 | Stone | |
| 5,293,930 A | 3/1994 | Pitasi | |
| 5,432,526 A | 7/1995 | Hyatt | |
| 5,535,816 A | 7/1996 | Ishida | |
| 5,559,614 A | 9/1996 | Urbish et al. | |
| 5,621,614 A | 4/1997 | O'Neill | |
| 5,657,641 A | 8/1997 | Cunningham et al. | |
| 5,748,269 A | 5/1998 | Harris et al. | |
| 5,765,743 A | 6/1998 | Sakiura et al. | |
| 5,767,489 A | 6/1998 | Ferrier | |
| 5,808,418 A | 9/1998 | Pitman et al. | |
| 5,818,010 A | 10/1998 | McCann | |
| 5,818,694 A | 10/1998 | Daikoku et al. | |
| 5,835,179 A | 11/1998 | Yamanaka | |
| 5,864,465 A | 1/1999 | Liu | |
| 5,869,818 A | 2/1999 | Kim | |
| 5,869,919 A | 2/1999 | Sato et al. | |
| 5,903,433 A | 5/1999 | Gudmundsson | |
| 5,991,153 A | 11/1999 | Heady et al. | |
| 6,003,015 A | 12/1999 | Kang et al. | |
| 6,007,205 A | 12/1999 | Fujimori | |
| 6,089,751 A | 7/2000 | Conover et al. | |
| 6,104,451 A | 8/2000 | Matsuoka et al. | |
| 6,125,565 A | 10/2000 | Hillstrom | |
| 6,157,432 A | 12/2000 | Helbing | |
| 6,181,070 B1 | 1/2001 | Dunn et al. | |
| 6,191,839 B1 | 2/2001 | Briley et al. | |
| 6,198,222 B1 | 3/2001 | Chang | |
| 6,211,934 B1 | 4/2001 | Habing et al. | |
| 6,215,655 B1 | 4/2001 | Heady et al. | |
| 6,351,381 B1 | 2/2002 | Bilski et al. | |
| 6,392,727 B1 | 5/2002 | Larson et al. | |
| 6,417,900 B1 | 7/2002 | Shin et al. | |
| 6,428,198 B1 | 8/2002 | Saccomanno et al. | |
| 6,473,150 B1 | 10/2002 | Takushima et al. | |
| 6,493,440 B2 | 12/2002 | Gromatsky et al. | |
| 6,504,713 B1 | 1/2003 | Pandolfi et al. | |
| 6,535,266 B1 | 3/2003 | Nemeth et al. | |
| 6,628,355 B1 | 9/2003 | Takahara | |
| 6,701,143 B1 | 3/2004 | Dukach et al. | |
| 6,714,410 B2 | 3/2004 | Wellhofer | |
| 6,727,468 B1 | 4/2004 | Nemeth | |
| 6,812,851 B1 | 11/2004 | Dukach et al. | |
| 6,825,828 B2 | 11/2004 | Burke et al. | |
| 6,839,104 B2 | 1/2005 | Taniguchi et al. | |
| 6,850,209 B2 | 2/2005 | Mankins et al. | |
| 6,885,412 B2 | 4/2005 | Ohnishi et al. | |
| 6,886,942 B2 | 5/2005 | Okada et al. | |
| 6,891,135 B2 | 5/2005 | Pala et al. | |
| 6,909,486 B2 | 6/2005 | Wang et al. | |
| 6,943,768 B2 | 9/2005 | Cavanaugh et al. | |
| 6,961,108 B2 | 11/2005 | Wang et al. | |
| 7,015,470 B2 | 3/2006 | Faytlin et al. | |
| 7,059,757 B2 | 6/2006 | Shimizu | |
| 7,083,285 B2 | 8/2006 | Hsu et al. | |
| 7,157,838 B2 | 1/2007 | Thielemans et al. | |
| 7,161,803 B1 | 1/2007 | Heady | |
| 7,190,587 B2 | 3/2007 | Kim et al. | |
| 7,209,349 B2 | 4/2007 | Chien et al. | |
| 7,212,403 B2 | 5/2007 | Rockenfeller | |
| 7,259,964 B2 | 8/2007 | Yamamura et al. | |
| 7,269,023 B2 | 9/2007 | Nagano | |
| 7,284,874 B2 | 10/2007 | Jeong et al. | |
| 7,452,121 B2 | 11/2008 | Cho et al. | |
| 7,457,113 B2 | 11/2008 | Kumhyr et al. | |
| 7,480,140 B2 | 1/2009 | Hara et al. | |
| 7,535,543 B2 | 5/2009 | Dewa et al. | |
| 7,591,508 B2 | 9/2009 | Chang | |
| 7,602,469 B2 | 10/2009 | Shin | |
| D608,775 S | 1/2010 | Leung | |
| 7,667,964 B2 | 2/2010 | Kang et al. | |
| 7,752,858 B2 | 7/2010 | Johnson et al. | |
| 7,753,567 B2 | 7/2010 | Kang et al. | |
| 7,800,706 B2 | 9/2010 | Kim et al. | |
| 7,813,124 B2 | 10/2010 | Karppanen | |
| 7,903,416 B2 | 3/2011 | Chou | |
| D635,614 S | 4/2011 | Yan | |
| 7,995,342 B2 | 8/2011 | Nakamichi et al. | |
| 8,004,648 B2 | 8/2011 | Dunn | |
| 8,035,968 B2 | 10/2011 | Kwon et al. | |
| 8,081,465 B2 | 12/2011 | Nishiura | |
| 8,102,173 B2 | 1/2012 | Merrow | |
| 8,142,027 B2 | 3/2012 | Sakai | |
| D657,421 S | 4/2012 | Yan | |
| D657,422 S | 4/2012 | Yan | |
| 8,208,115 B2 | 6/2012 | Dunn | |
| 8,223,311 B2 | 7/2012 | Kim et al. | |
| 8,241,573 B2 | 8/2012 | Banerjee et al. | |
| 8,248,784 B2 | 8/2012 | Nakamichi et al. | |
| 8,254,121 B2 | 8/2012 | Lee et al. | |
| 8,269,916 B2 | 9/2012 | Ohkawa | |
| 8,270,163 B2 | 9/2012 | Nakamichi et al. | |
| 8,274,622 B2 | 9/2012 | Dunn | |
| 8,274,789 B2 | 9/2012 | Nakamichi et al. | |
| D669,938 S | 10/2012 | Lard et al. | |
| 8,300,203 B2 | 10/2012 | Nakamichi et al. | |
| 8,320,119 B2 | 11/2012 | Isoshima et al. | |
| 8,351,014 B2 | 1/2013 | Dunn | |
| 8,358,397 B2 | 1/2013 | Dunn | |
| 8,369,083 B2 | 2/2013 | Dunn et al. | |
| 8,373,841 B2 | 2/2013 | Dunn | |
| 8,379,182 B2 | 2/2013 | Dunn | |
| 8,400,608 B2 | 3/2013 | Takahashi et al. | |
| 8,472,174 B2 | 6/2013 | Idems et al. | |
| 8,472,191 B2 | 6/2013 | Yamamoto et al. | |
| 8,482,695 B2 | 7/2013 | Dunn | |
| 8,497,972 B2 | 7/2013 | Dunn et al. | |
| 8,649,170 B2 | 2/2014 | Dunn et al. | |
| 8,649,176 B2 | 2/2014 | Okada et al. | |
| 8,654,302 B2 | 2/2014 | Dunn et al. | |
| 8,678,603 B2 | 3/2014 | Zhang | |
| 8,693,185 B2 | 4/2014 | Dunn et al. | |
| 8,700,226 B2 | 4/2014 | Schuch et al. | |
| 8,711,321 B2 | 4/2014 | Dunn et al. | |
| D704,265 S | 5/2014 | Yan | |
| 8,749,749 B2 | 6/2014 | Hubbard | |
| 8,755,021 B2 | 6/2014 | Hubbard | |
| 8,760,613 B2 | 6/2014 | Dunn | |
| 8,767,165 B2 | 7/2014 | Dunn | |
| 8,773,633 B2 | 7/2014 | Dunn et al. | |
| 8,804,091 B2 | 8/2014 | Dunn et al. | |
| 8,823,916 B2 | 9/2014 | Hubbard et al. | |
| 8,854,572 B2 | 10/2014 | Dunn | |
| 8,854,595 B2 | 10/2014 | Dunn | |
| 8,879,042 B2 | 11/2014 | Dunn | |
| 8,988,647 B2 | 3/2015 | Hubbard | |
| 9,030,641 B2 | 5/2015 | Dunn | |
| 9,089,079 B2 | 7/2015 | Dunn | |
| 9,119,325 B2 | 8/2015 | Dunn et al. | |
| 9,119,330 B2 | 8/2015 | Hubbard et al. | |
| 9,173,322 B2 | 10/2015 | Dunn | |
| 9,173,325 B2 | 10/2015 | Dunn | |
| 9,282,676 B1 | 3/2016 | Diaz | |
| 9,285,108 B2 | 3/2016 | Dunn et al. | |
| 9,313,917 B2 | 4/2016 | Dunn et al. | |
| 9,370,127 B2 | 6/2016 | Dunn | |
| 9,448,569 B2 | 9/2016 | Schuch et al. | |
| 9,451,060 B1 | 9/2016 | Bowers et al. | |
| 9,451,733 B2 | 9/2016 | Dunn et al. | |
| 9,456,525 B2 | 9/2016 | Yoon et al. | |
| 9,470,924 B2 | 10/2016 | Dunn et al. | |
| 9,500,896 B2 | 11/2016 | Dunn et al. | |
| 9,516,485 B1 | 12/2016 | Bowers et al. | |
| 9,549,490 B2 | 1/2017 | Hubbard | |
| 9,594,271 B2 | 3/2017 | Dunn et al. | |
| 9,613,548 B2 | 4/2017 | DeMars | |
| 9,622,392 B1 | 4/2017 | Bowers et al. | |
| 9,629,287 B2 | 4/2017 | Dunn | |

(56) References Cited

U.S. PATENT DOCUMENTS

| | | | |
|---|---|---|---|
| 9,648,790 B2 | 5/2017 | Dunn et al. |
| 9,703,320 B2 | 7/2017 | Bowers et al. |
| 9,723,765 B2 | 8/2017 | DeMars |
| 9,823,690 B2 | 11/2017 | Bowers et al. |
| 2001/0001459 A1 | 5/2001 | Savant et al. |
| 2001/0019454 A1 | 9/2001 | Tadic-Galeb et al. |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2009/0009047 A1 | 1/2009 | Yanagawa et al. |
| 2009/0009729 A1 | 1/2009 | Sakai |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0244472 A1 | 10/2009 | Dunn |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ............... G02F 1/133385 361/695 |
| 2011/0114384 A1 | 5/2011 | Sakamoto et al. |
| 2011/0116000 A1 | 5/2011 | Dunn et al. |
| 2011/0122162 A1 | 5/2011 | Sato et al. |
| 2011/0141724 A1 | 6/2011 | Erion |
| 2011/0261523 A1* | 10/2011 | Dunn ............... G02F 1/133308 361/679.21 |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |

(56) References Cited

U.S. PATENT DOCUMENTS

| | | | |
|---|---|---|---|
| 2013/0258659 A1 | 10/2013 | Erion | |
| 2013/0279154 A1* | 10/2013 | Dunn | G02F 1/133385 362/97.3 |
| 2013/0294039 A1 | 11/2013 | Chao | |
| 2014/0085564 A1 | 3/2014 | Hendren et al. | |
| 2014/0111758 A1 | 4/2014 | Dunn et al. | |
| 2014/0113540 A1 | 4/2014 | Dunn et al. | |
| 2014/0134767 A1 | 5/2014 | Ishida et al. | |
| 2014/0313666 A1 | 10/2014 | Chin | |
| 2014/0313698 A1 | 10/2014 | Dunn et al. | |
| 2014/0314395 A1 | 10/2014 | Dunn et al. | |
| 2014/0334100 A1 | 11/2014 | Yoon et al. | |
| 2014/0361138 A1 | 12/2014 | Ramirez et al. | |
| 2015/0009625 A1 | 1/2015 | Chin et al. | |
| 2015/0192371 A1 | 7/2015 | Hancock | |
| 2015/0264826 A1 | 9/2015 | Dunn et al. | |
| 2015/0319882 A1 | 11/2015 | Dunn et al. | |
| 2015/0366101 A1 | 12/2015 | Dunn et al. | |
| 2016/0041423 A1 | 2/2016 | Dunn | |
| 2016/0044829 A1 | 2/2016 | Dunn | |
| 2016/0192536 A1 | 6/2016 | Diaz | |
| 2016/0195254 A1 | 7/2016 | Dunn et al. | |
| 2016/0198588 A1 | 7/2016 | DeMars | |
| 2016/0238876 A1 | 8/2016 | Dunn et al. | |
| 2016/0242329 A1 | 8/2016 | DeMars | |
| 2016/0242330 A1 | 8/2016 | Dunn | |
| 2016/0249493 A1 | 8/2016 | Dunn et al. | |
| 2016/0302331 A1 | 10/2016 | Dunn | |
| 2017/0023823 A1 | 1/2017 | Dunn et al. | |
| 2017/0068042 A1 | 3/2017 | Dunn et al. | |
| 2017/0074453 A1 | 3/2017 | Bowers et al. | |
| 2017/0083043 A1 | 3/2017 | Bowers et al. | |
| 2017/0083062 A1 | 3/2017 | Bowers et al. | |
| 2017/0111486 A1 | 4/2017 | Bowers et al. | |
| 2017/0111520 A1 | 4/2017 | Bowers et al. | |
| 2017/0111521 A1 | 4/2017 | Bowers et al. | |
| 2017/0127579 A1 | 5/2017 | Hubbard | |
| 2017/0140344 A1 | 5/2017 | Bowers et al. | |
| 2017/0147992 A1 | 5/2017 | Bowers et al. | |
| 2017/0163519 A1 | 6/2017 | Bowers et al. | |
| 2017/0175411 A1 | 6/2017 | Bowers et al. | |
| 2017/0188490 A1 | 6/2017 | Dunn et al. | |
| 2017/0245400 A1 | 8/2017 | Dunn et al. | |
| 2017/0257978 A1 | 9/2017 | Diaz | |
| 2019/0089176 A1 | 3/2019 | Dunn et al. | |

FOREIGN PATENT DOCUMENTS

| | | |
|---|---|---|
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| GB | 2402205 A | 12/2004 |
| JP | 402062015 A | 3/1990 |
| JP | 402307080 A | 12/1990 |
| JP | 3153212 A | 7/1991 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000010501 A | 1/2000 |
| JP | 2001209126 A | 8/2001 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010102227 A | 5/2010 |
| JP | 2011503663 A | 1/2011 |
| JP | 2011075819 A | 4/2011 |
| JP | 2012133254 A | 7/2012 |
| JP | 2013537721 A | 10/2013 |
| JP | 2014225595 A | 12/2014 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | 2013182733 A1 | 12/2013 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | 2016127613 A1 | 8/2016 |
| WO | WO2016133852 A1 | 8/2016 |
| WO | WO2017152166 A1 | 9/2017 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.

(56) References Cited

OTHER PUBLICATIONS

Yeh, Thermal Management of Microelectronic Equipment, Oct. 15, 2002, 148 pages.
Civiq Smartscapes, FlexVue Ferro 55P/55L, Mar. 16, 2017, 4 pages.
Adnation,Turn Key Advertising Technology Solutions, May 23, 2017, 4 pages.
Vertigo Digital Displays, All Products Catalogue, 2017,14 pages.
Vertigo Digital Displays, FlexVu Totem Shelter, 2017, 2 pages.
Vertigo Digital Displays, Innovation on Display FlexVu Totem Brochure, 2014, 6 pages.
Miller, Adnation, photos, May 9, 2017, 28 pages.
Civiq, Invalidity Claim Charts, Appendix A—Appendix D, Jan. 24, 2018, 51 pages.
Civiq, Invalidity Contentions, Jan. 24, 2018, 51 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes LLC.* v *Manufacturing Resources International, Inc.*, Defendant's Amended Answer and Counterclaims to Plaintiffs First Amended Complaint, filed Apr. 24, 2018, 240 pages.

\* cited by examiner

COOLING SYSTEM FOR DOUBLE SIDED DISPLAY ASSEMBLY

CROSS REFERENCE TO RELATED APPLICATIONS

The application claims the benefit of U.S. Provisional Patent Application No. 62/303,806 filed on Mar. 4, 2016, which is hereby incorporated by reference in its entirety.

TECHNICAL FIELD

Embodiments of the present invention generally relate to cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise multiple separate flow paths for a fluid, such as air, through an electronic display housing. At least one path may be a closed loop and several other paths may provide open loops. The closed loop path preferably circulates through a sealed electronics compartment as well as pass between the electronic display(s) and a front transparent panel. A first open loop of ambient air may pass behind the first electronic display while a second path of ambient air may pass behind the second electronic display. In some embodiments the open loop air also removes heat from a thermal plate having electronic components and in some embodiments the open loop air also removes heat from an LED backlight (or LED display). The fans can be positioned so as to precisely control the amount of fluid travelling through each path.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
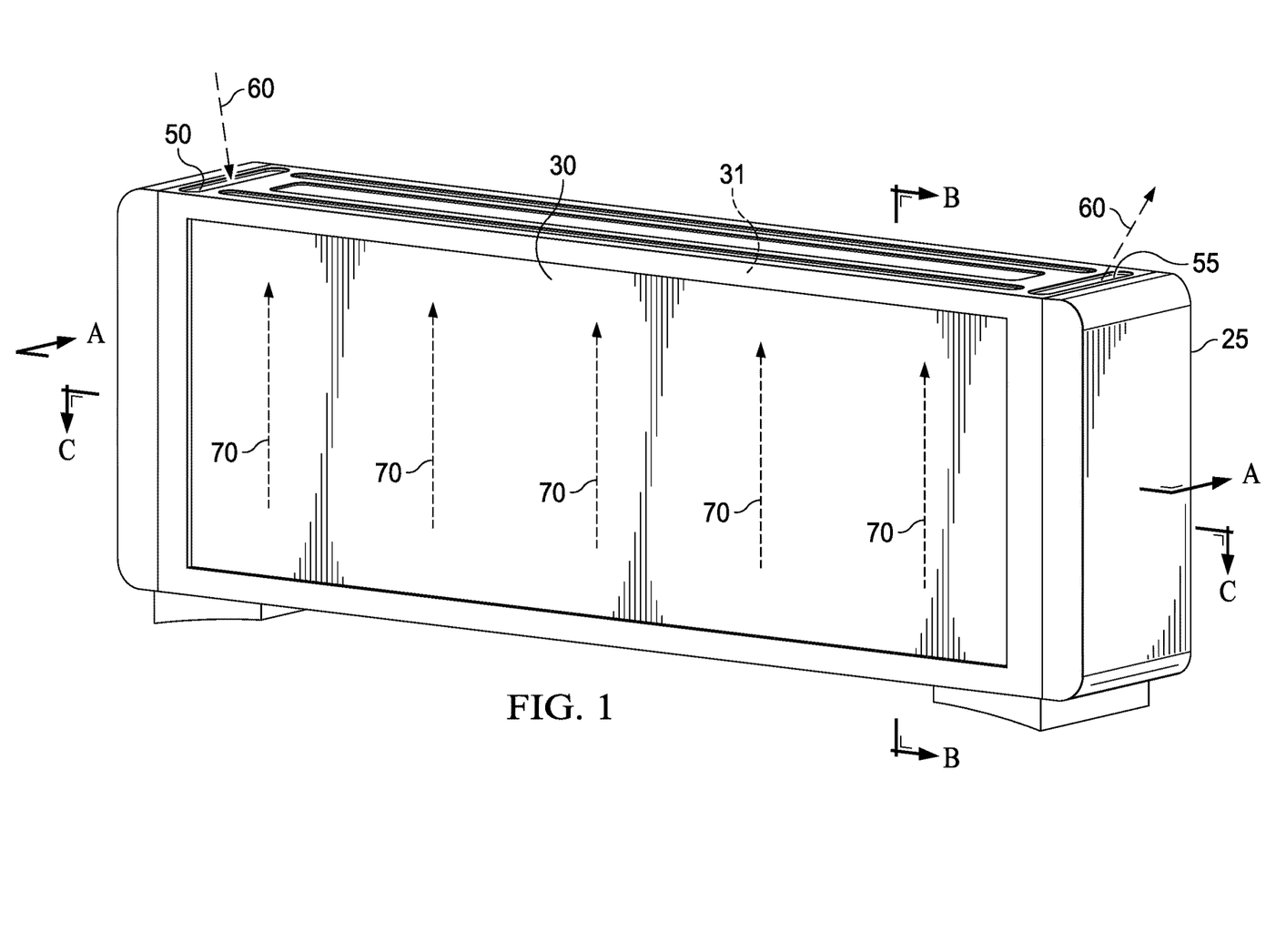
FIG. 1 is a front perspective view showing an exemplary embodiment of the double sided display assembly, as well as the location for section lines A-A, B-B, and C-C.

FIG. 1 is a front perspective view showing an exemplary embodiment of the double sided display assembly, as well as the location for section lines A-A, B-B, and C-C. Generally speaking, an exemplary embodiment includes two displays 30 and 31 positioned back to back and placed within a housing 25. An inlet aperture 50 accepts a flow of ambient air 60 into and through the housing 25. The ambient air 60 is preferably exhausted out of the housing 25 through the exhaust aperture 55. A closed loop flow of circulating gas 70 travels within the housing 25 as well, but preferably does not mix with the flow of ambient air 60 in any substantial manner.

As used herein, the term ambient air 60 simply refers to common atmospheric air that would provide the surrounding environment for the assembly. This ambient air 60 is known to contain a mixture of different types of gaseous elements, as well as dust, dirt, pollen, water vapor, and other particulate. Also as used herein, the term circulating gas 70 can refer to any gaseous matter, which might be a mixture of different types of gases or could be a pure gaseous matter. Preferably, the circulating gas 70 does not contain substantial amounts of dust, dirt, pollen, or other types of particulate.

Exemplary embodiments of the present invention may be configured for mounting to a vehicle, preferably to the roof. The housing 25 may be sized and configured for fitting atop a vehicle roof. Further, the housing 25 may be sized and adapted to minimize aerodynamic drag. The housing 25 may comprise a pair of feet 26 for mounting the housing 25 to the vehicle. The feet 26 may be sized and configured to be secured to a vehicle's roof, or to be secured to internal supports placed on or within the vehicle. In such embodiments, the housing 25 is preferably thin and comprises rounded corners and other features to minimize aerodynamic drag. The housing 25 may comprise a variety of stiffening members to provide structural rigidity and strength to accommodate the forces caused by a moving vehicle. Likewise, the various components of the display assembly may be configured or comprised of a sufficiently rigid material so as to accommodate the forces caused by a moving vehicle. Furthermore, the housing and various components of the display assembly may be configured to withstand the forces, vibrations, and other rigors of being mounted to a vehicle. For example, but not to serve as a limitation, the feet 26 and other components of the display assembly may comprise rubber pads or other vibration and shock absorption devices.

As indicated in the figure, section line A-A is positioned horizontally down the center of the assembly and cuts through the assembly vertically. Section line B-B is oriented vertically and cuts through the assembly horizontally. Finally, section line C-C is oriented horizontally and cuts through the assembly horizontally as well. The section line arrows in FIG. 1 indicate the direction of hypothetical cut to obtain the section view.

Figure 2:
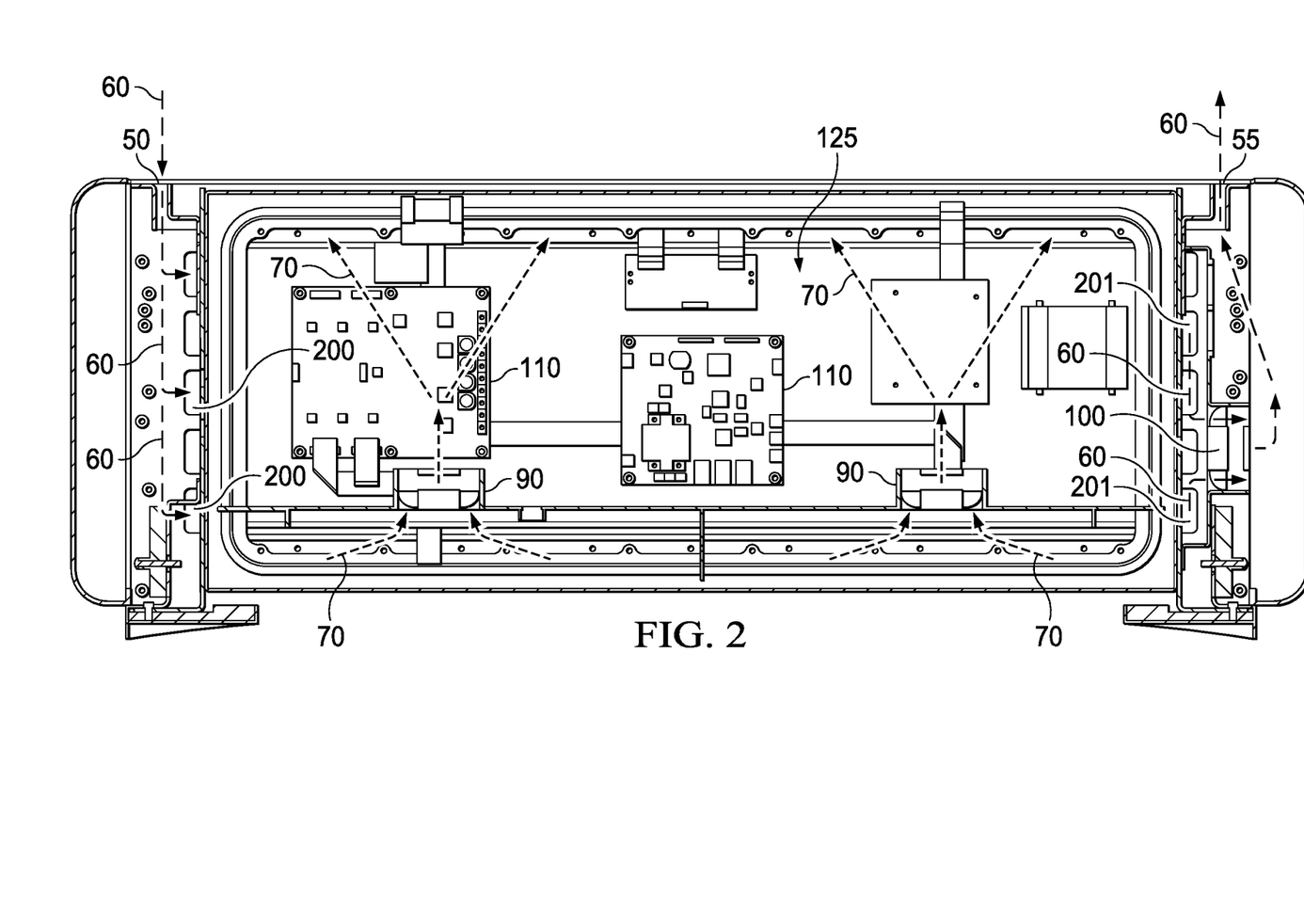
FIG. 2 is a side section view of the embodiment shown in FIG. 1, taken along the section line A-A.

FIG. 2 is a side section view of the embodiment shown in FIG. 1, taken along the section line A-A. The ambient air 60 may enter the housing 25 through the inlet aperture 50, where it may then be directed into an entrance plenum, and pass through one of a plurality of entrance apertures 200 which connect with the open loop channels (described further below). The ambient air 60 is preferably pulled by one or more fans 100, but the fans 100 could also be positioned to push the ambient air 60, or several fans could be used for a combination of push/pull. In this particular embodiment, the fan 100 is located near an exit plenum, where the ambient air 60 is collected from the open loop channels by travelling through one of a plurality of exit aperture 201, collected within the exit plenum, and directed out of the housing 25 through the exhaust aperture 55.

As will be described further below, the entrance apertures 200 and exit apertures 201 are in gaseous communication with a first open loop channel running behind the electronic display 31. There is preferably another set of entrance apertures and exit apertures on the opposite side of the assembly (not shown in this view), which communicate with a second open loop channel running behind the electronic display 30. The apertures 200 and 201 are preferably distributed across the width of the electronic display 30/31 in a substantially equidistant manner from one another. The apertures 200/201 allow the flow of ambient air 60 to pass through the housing 25 and the open loop channels without substantially mixing with the circulating gas 70 or entering the sealed electronics compartment 125.

A plurality of electronic components 110 are preferably placed within a sealed electronics compartment 125 which forms a part of the closed loop for the circulating gas 70. The electronic components 110 may comprise one or more of the following: power modules, video player, electronic data storage, microprocessor, satellite/wireless receiver/transmitter, and timing and control board. At least some of the electronic components 110 may be in electrical connection with the displays 30 and 31.

One or more fans 90 may force the closed loop of circulating gas 70 over the electronic components 110. While shown with two fans 90, this is not required. Additionally, while shown pushing the circulating gas 70 over the electronic components 110, this is not required as the fans 90 could also be positioned to pull the circulating gas 70, or several fans 90 could be used in a combination push/pull of the circulating gas 70.

Figure 3:
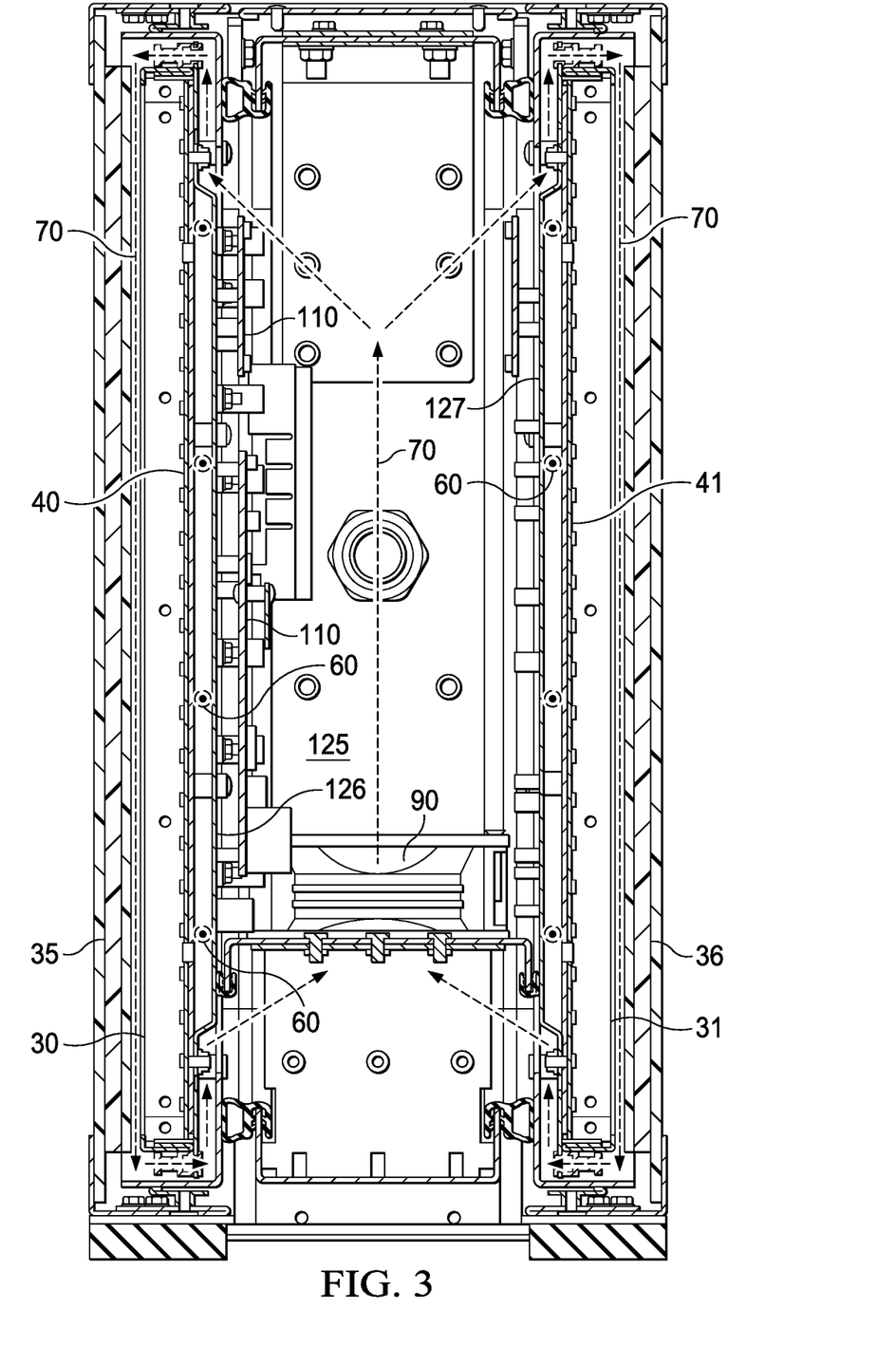
FIG. 3 is a front section view of the embodiment shown in FIG. 1, taken along the section line B-B.

FIG. 3 is a front section view of the embodiment shown in FIG. 1, taken along the section line B-B. Here, the closed loop of circulating gas 70 can be clearly shown. As mentioned above, the circulating gas 70 preferably travels over the electronic components 110 within the sealed electronics compartment 125 and then splits to wrap around each of the displays 30 and 31. Regarding the first display 30, a transparent panel 35 is preferably placed in front of the display 30 to define a closed loop channel between the display 30 and the transparent panel 35 for accepting circulating gas 70. Once the circulating gas 70 has travelled across the display 30, it is directed back in to the sealed electronics compartment 125 to begin the closed loop again.

Similarly, regarding the second display 31, a transparent panel 36 is preferably placed in front of the display 31 to define a closed loop channel between the display 31 and the transparent panel 36 for accepting circulating gas 70. Once the circulating gas 70 has travelled across the display 31, it is directed back in to the sealed electronics compartment 125 to begin the closed loop again.

As shown, the flow of ambient air 60 is preferably split into at least two channels, with one open loop channel travelling behind each display. Regarding display 30, a path of ambient air 60 preferably travels between the rear surface of the display 30 and a thermal wall 126 of the sealed electronics compartment 125. Although not required, when using a direct LED backlit LCD as the display 30, the ambient air 60 preferably travels between the rear surface of the LED backlight 40 and the thermal wall 126. As shown above, a plurality of electronic components 110 are preferably attached to (or near) one or both thermal walls 126 and 127. In this way, heat from the electronic components 110 may be transferred (preferably through conduction but some convection and radiation may occur as well) to the walls 126 and 127 and removed by the flow of ambient air 60.

Similarly regarding display 31, a path of ambient air 60 preferably travels between the rear surface of the display 31 and a thermal wall 127 of the sealed electronics compartment 125. Although not required, when using a direct LED backlit LCD as the display 31, the ambient air 60 preferably travels between the rear surface of the LED backlight 41 and the thermal wall 127. It should be expressly noted that although a direct LED backlit LCD is shown in these embodiments, this type of display and its associated backlight is not necessary for every embodiment. The displays 30 and 31 could be any one of the following: plasma, OLED, LCD (direct lit or edge lit), LED, and any type of electroluminescent polymer display.

Figure 4:
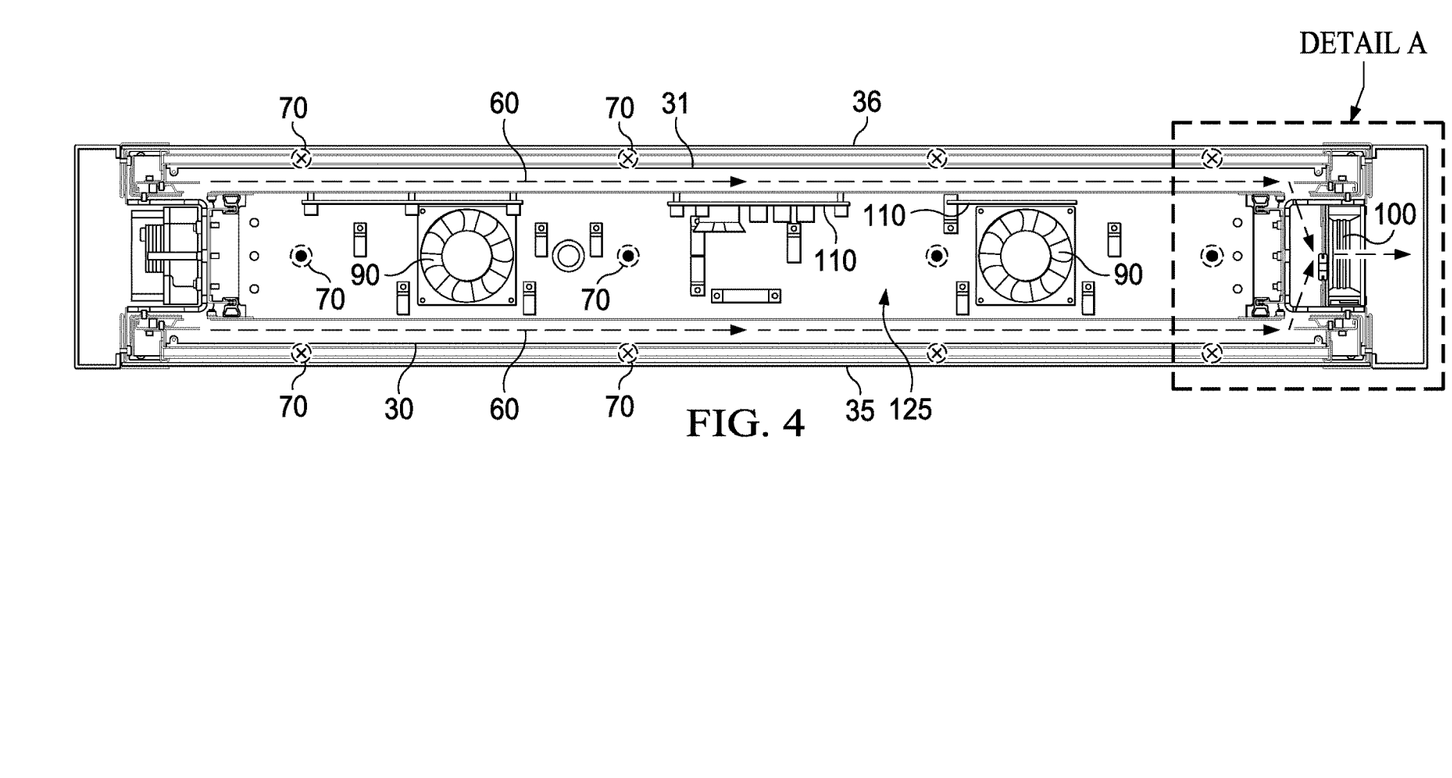
FIG. 4 is a top section view of the embodiment shown in FIG. 1, taken along the section line C-C and indicating the location for Detail A.

FIG. 4 is a top section view of the embodiment shown in FIG. 1, taken along the section line C-C and indicating the location for Detail A. In this figure, the two channels for ambient air 60 behind each of the displays 30 and 31 can be seen. Again, preferably the two paths of ambient air 60 can remove heat from the electronic displays 30 and 31 as well as the electronics 110 (through the thermal walls 126 and 127).

Figure 5:
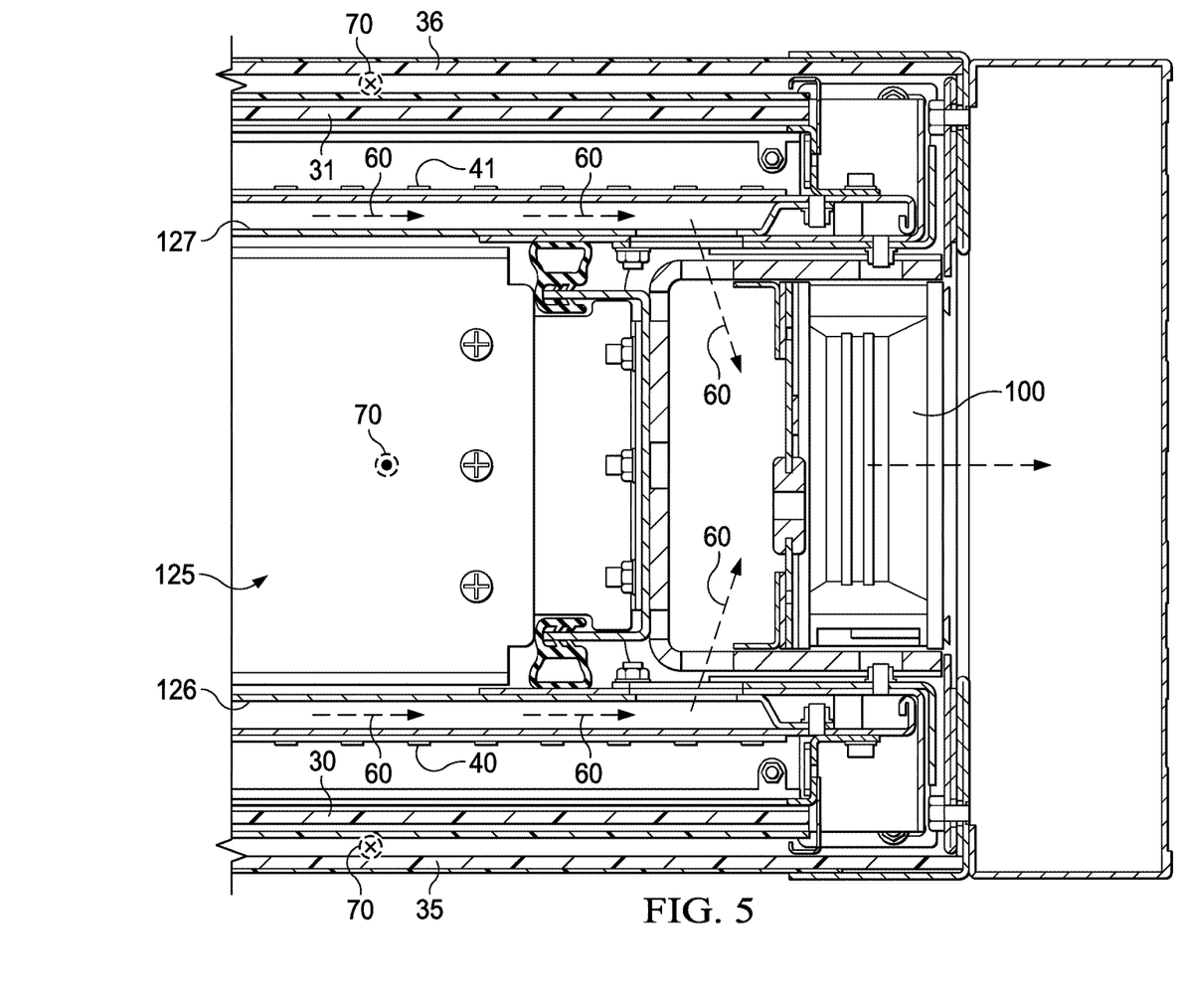
FIG. 5 is a detailed section view of Detail A.

FIG. 5 is a detailed section view of Detail A. Once the ambient air 60 has travelled through each of the open loop channels, it can be gathered by the exit plenum and forced out of the display housing 25 by the fan 100.

Figure 6:
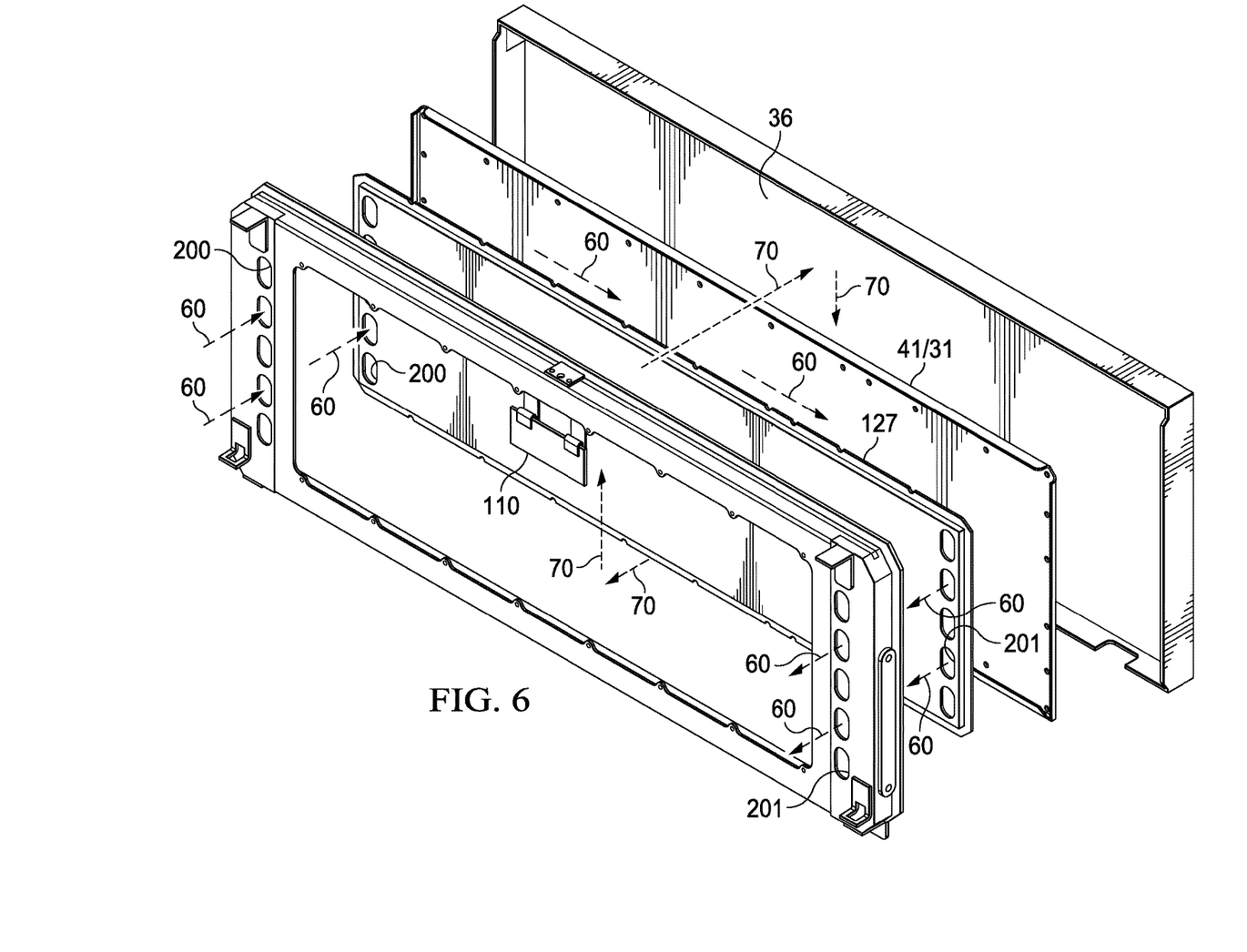
FIG. 6 is a partial exploded view of the embodiment shown in FIG. 1.

FIG. 6 is a partial exploded view of the embodiment shown in FIG. 1. This shows the stacking of the elements for one side of the assembly, i.e. the components surrounding electronic display 31. The ambient air 60 is preferably directed through the entrance apertures 200 so that it may pass between the thermal plate 127 and the rear of the electronic display 31 (in this embodiment, the rear surface of the LED backlight 41). Once passing through the open loop channel, the ambient air 60 is preferably directed out of an exit aperture 201 so that it can be collected in the exit plenum and exhausted out of the display housing. The circulating gas 70 generally encircles the open loop channel(s) having the ambient air 60. In other words, the open loop ambient air 60 passes through the center of the closed loop of circulating gas 70.

As noted above, the circulating gas 70 preferably passes over electronic components 110, exits the sealed electronics compartment 125, travels between the front transparent plate 36 and the front of the electronic display 31, eventually returning to the sealed electronics compartment 125. Again it should be noted that only one half of the embodiment is shown in this partial exploded view. Generally, there would be a second closed loop of circulating gas 70 travelling around the opposing display 30 and a second open loop channel for ambient air 60 passing behind the display 30, as shown and described above.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clockwise or counter-clockwise direction. Further, the open loop may also be horizontal or vertical and can run left to right, right to left, and top to bottom, or bottom to top.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A display assembly for mounting to a roof of a vehicle comprising:
 a housing adapted to be mounted to the roof of the vehicle, said housing defining at least a bottom wall, a front wall, and a rear wall;
 a first and second electronic display positioned in a back to back arrangement within the housing, wherein each of said first and second electronic displays has a front surface and a rear surface;
 a first and second transparent panel, wherein each of said first and second transparent panels are positioned in front of the front surface of one of the first and second electronic displays;
 a first and second thermal plate, wherein each of said first and second thermal plates are positioned behind the rear surface of one of the first and second electronic displays;
 an open loop pathway comprising:
  an inlet aperture located in the housing for ingesting ambient air;
  a first and second open loop channel, wherein each of the first and second open loop channels are located between one of the first and second thermal plates, respectively, and the rear surface of one of the first and second electronic displays, respectively;
  a number of entrance apertures located on each of the first and second thermal plates, wherein each of said entrance apertures are configured to permit gaseous communication between the inlet aperture and the first and second open loop channels, respectively;
  an exhaust aperture located in the housing for exhausting ambient air;
  a number of exit apertures located on each of the first and second thermal plates, wherein each of said exit apertures are configured to permit gaseous communication between the exhaust aperture and the first and second open loop channels, respectively; and
  one or more open loop fans positioned vertically along said rear wall of said housing between each of the number of exit apertures and the exhaust aperture;
  wherein the one or more open loop fans, when operated, are configured to pull a flow of ambient air through said inlet aperture, split said flow after entering the inlet aperture such that a portion of said flow travels through each of said entrance apertures and each of said first and second open loop channels, through each of said number of exit apertures, and rejoin said split flow, after exiting each of said exit apertures, prior to pushing the flow through said exhaust aperture to exhaust said flow; and
 a closed loop pathway comprising:
  a first and second closed loop channel, wherein each of said first and second closed loop channels are located between one of the first and second transparent panels, respectively, and one of the first and second electronic displays, respectively;
  a sealed electronics compartment defined by the first and second thermal plates, wherein the sealed electronics compartment is configured to permit gaseous communication with each of the first and second closed loop channels, and wherein said sealed electronics compartment defines a plenum which accepts only circulating gas; and
  a plurality of closed loop fans spaced apart between said first and second electronic displays and along a bottom wall of siad housing;
  wherein said plurality of closed loop fans are configured to circulate circulating gas vertically through said first and second closed loop channels and the sealed electronics compartment;
 a number of electronic components placed within the sealed electronics compartment, wherein said number of electronic components are selected from the group consisting of: power modules, video players, eletronic data storage devices, microprocessors, wireless transmitters/receivers, and timing and control boards.

2. The display assembly of claim 1, wherein:
 at least some of the number of electronic components are mounted to a rear surface of at least one of the first and second thermal plates.

3. The display assembly of claim 1, further comprising:
 a number of feet attached to said housing, wherein each of said feet has a lower surface which is configured to contact, and substantially match the pitch of, an upper surface of the roof of the vehicle.

4. The display assembly of claim 1, wherein:

each of the number of entrance apertures are spaced apart along a first end of each of the first and second thermal plates; and each of the number of exit apertures are spaced apart along a second end of the first and second thermal plates.

5. The display assembly of claim 4, wherein:

each of the number of entrance apertures are vertically spaced apart; and each of the number of exit apertures are vertically spaced apart.

6. The display assembly of claim 5, wherein:

each of said number of entrance apertures are positioned outside of the sealed electronics compartment; and each of said number of exit apertures are positioned outside of the sealed electronics compartment.

* * * * *